United States Patent
Park et al.

(10) Patent No.: US 10,925,169 B2
(45) Date of Patent: Feb. 16, 2021

(54) METHOD FOR MANUFACTURING TRANSPARENT LIGHT EMITTING DEVICE BY USING UV IMPRINTING TECHNOLOGY AND TRANSPARENT LIGHT EMITTING DEVICE MANUFACTURED THEREBY

(71) Applicants: Seung Hwan Park, Seoul (KR); Dong Jun Lee, Siheung-si (KR)

(72) Inventors: Seung Hwan Park, Seoul (KR); Dong Jun Lee, Siheung-si (KR); Kyung Do Kim, Seoul (KR); Kwang Ho Lee, Seoul (KR)

(73) Assignees: Seung Hwan Park, Seoul (KR); Dong Jun Lee, Siheung-si (KR)

( * ) Notice: Subject to any disclaimer, the term of this patent is extended or adjusted under 35 U.S.C. 154(b) by 0 days.

(21) Appl. No.: 16/475,663

(22) PCT Filed: Dec. 29, 2017

(86) PCT No.: PCT/KR2017/015712
§ 371 (c)(1),
(2) Date: Jul. 2, 2019

(87) PCT Pub. No.: WO2018/124804
PCT Pub. Date: Jul. 5, 2018

(65) Prior Publication Data
US 2019/0350086 A1    Nov. 14, 2019

(30) Foreign Application Priority Data
Jan. 2, 2017    (KR) ........................ 10-2017-0000263

(51) Int. Cl.
*H01L 33/44*    (2010.01)
*H05K 3/12*    (2006.01)
(Continued)

(52) U.S. Cl.
CPC ....... *H05K 3/1258* (2013.01); *H01L 25/0753* (2013.01); *H05K 1/147* (2013.01); *H05K 1/189* (2013.01); *H05K 3/0044* (2013.01); *H05K 3/0055* (2013.01); *H05K 3/34* (2013.01); *H05K 3/361* (2013.01); *H05K 2201/10106* (2013.01); *H05K 2201/10128* (2013.01)

(58) Field of Classification Search
CPC . G09F 9/33; H01L 33/42; H01L 33/44; H01L 51/52; H01L 27/32
See application file for complete search history.

(56) References Cited

U.S. PATENT DOCUMENTS 7,994,053 B2    8/2011    Park et al.
9,620,683 B2    4/2017    Lee et al.
(Continued)

FOREIGN PATENT DOCUMENTS

JP    2016-127018 A    7/2016
JP    2016-127289 A    7/2016
(Continued)

OTHER PUBLICATIONS

KR Office Action dated Nov. 24, 2017 as received in Application No. 10-2017-0000263.
(Continued)

*Primary Examiner* — Thomas L Dickey
(74) *Attorney, Agent, or Firm* — Maschoff Brennan

(57) ABSTRACT

The present invention relates to: a method for manufacturing a transparent light emitting device, which can minimize the manufacturing time of a large-area high-resolution transparent light emitting device and maximize the productivity thereof by forming an integrated metal mesh circuit pattern through a UV imprinting technology; and a transparent light emitting device manufactured thereby.

4 Claims, 6 Drawing Sheets

(51) Int. Cl.
  *H01L 25/075*  (2006.01)
  *H05K 1/14*  (2006.01)
  *H05K 1/18*  (2006.01)
  *H05K 3/00*  (2006.01)
  *H05K 3/34*  (2006.01)
  *H05K 3/36*  (2006.01)

(56) References Cited

U.S. PATENT DOCUMENTS

| | | |
|---|---|---|
| 9,766,763 B2 | 9/2017 | Jinbo et al. |
| 2010/0263246 A1 | 10/2010 | Oh et al. |

FOREIGN PATENT DOCUMENTS

| | | |
|---|---|---|
| KR | 10-2008-0020182 A | 3/2008 |
| KR | 10-2009-0047062 A | 5/2009 |
| KR | 10-0965904 B1 | 6/2010 |
| KR | 10-2010-0083956 A | 7/2010 |
| KR | 10-2012-0100303 A | 9/2012 |
| KR | 10-2013-0077059 A | 7/2013 |
| KR | 10-2014-0055607 A | 5/2014 |
| KR | 10-2014-0122528 A | 10/2014 |
| KR | 10-1668273 B1 | 10/2016 |

OTHER PUBLICATIONS

KR Final Office Action dated Feb. 27, 2018 as received in Application No. 10-2017-0000263.
KR Decision of Grant dated Apr. 2, 2018 as received in Application No. 10-2017-0000263.

Fig. 5
(a)
(b)

METHOD FOR MANUFACTURING TRANSPARENT LIGHT EMITTING DEVICE BY USING UV IMPRINTING TECHNOLOGY AND TRANSPARENT LIGHT EMITTING DEVICE MANUFACTURED THEREBY

TECHNICAL FIELD

The present invention relates to a method for manufacturing a transparent light emitting device by using a UV imprinting technology and a transparent light emitting device manufactured thereby, and more particularly, to a method for manufacturing a transparent light emitting device by using a UV imprinting technology in which an integral metal mesh circuit pattern is formed through a UV imprinting technology so that the number of production processes of a high-resolution transparent light emitting device of a large area can be minimized and productivity can be maximized, and a transparent light emitting device manufactured thereby.

BACKGROUND ART

In general, a light emitting device using light emitting diodes has an advantage of low power and a long life span, and is utilized in an outdoor large-scale electronic display panel, an indoor small-scale electronic display panel, or various promotion facility devices.

Meanwhile, the light emitting diodes are generally mounted on an opaque PCB, and when the light emitting diodes are installed on a glass window of a vehicle or a glass window of a store, the field of view is hidden by the opaque PCB and the transparency of the inside and the outside cannot be secured so that the user feels inconvenient.

In order to solve this, a transparent light emitting device that can secure transparency by mounting an LED element on a substrate, in which a transparent circuit layer is formed, has been developed and used.

However, as a preceding process for flow of a current, in the conventional transparent light emitting device, a circuit pattern has to be formed after an oxide such as ITO, IZO, or ZnO or a silver nano wire is deposited or a transparent substrate in which a circuit pattern is formed has to be stacked on or combined with another transparent substrate. Accordingly, a process of forming a circuit pattern becomes complex and productivity deteriorates.

Further, the conventional transparent light emitting device is designed such that a flexible printed circuit board (FPCB) is bonded while deviating from a periphery of a panel and facing the outside.

In this case, there is a possibility of the pin of the flexible printed circuit board coming off from the circuit pattern while a distal end of the flexible printed circuit board is lifted, and also there is a possibility of an intermediate portion of the flexible printed circuit board being folded, causing a short-circuit because the pin and the circuit pattern are not pressed.

DETAILED DESCRIPTION OF THE INVENTION

Technical Problem

The present invention provides a method for manufacturing a transparent light emitting device and a transparent light emitting device manufactured thereby, by which an electric circuit in a form of a metal mesh can be formed by promptly imprinting an integral circuit pattern through a UV imprinting technology and filling a conductive material in the circuit pattern.

In particular, the present invention provides a method for manufacturing a transparent light emitting device and a transparent light emitting device manufactured thereby, by which the number of manufacturing processes of the high-resolution transparent light emitting device of a large area can be minimized and productivity can be maximized by promptly imprinting an integral circuit pattern by using a mold.

Technical Solution

A method for manufacturing a transparent light emitting device using a UV imprinting technology according to an embodiment of the present invention includes: forming a substrate layer; forming a circuit pattern in a resin layer located on the upper side of the substrate layer through a mold; and mounting and soldering an LED element on the resin layer.

In an embodiment, the forming of the circuit pattern may include: imprinting the circuit pattern by pressing the resin layer through a mold pin located on the lower side of the mold; curing the resin layer by irradiating an ultraviolet ray to the imprinted circuit pattern; and forming the circuit pattern in a metal mesh form by filling a liquid conductive material in the circuit pattern after removing the mold.

In an embodiment, the mounting and soldering of the LED element may include: forming a seating recess in which the LED element is seated, in the circuit pattern; seating the LED element in the seating recess; Soldering the LED element such that an electrode terminal of the LED element is electrically connected to the conductive material; and bonding a flexible printed circuit board (FPCB) for applying a voltage to the conductive material to the circuit pattern by using an ACF bonding technology.

In an embodiment, the bonding of the flexible printed circuit board (FPCB) may include: locating a surface of the flexible printed circuit board (FPCB), on which a pin is printed, such that the surface of the flexible printed circuit board (FPCB) faces an upper surface of the circuit pattern; and bonding a facing surface of the circuit pattern which faces one end of the pin by using an ultrasonic ACF bonding technology or a thermal fusion ACF bonding technology.

In an embodiment, the bonding of the flexible printed circuit board (FPCB) may include: removing a remaining area of the entire area of the flexible printed circuit board, except for an area in which the pin is printed.

The present invention may further include stacking a cover layer for preventing penetration of foreign substances on the upper side of the substrate layer.

A transparent light emitting device according to an embodiment of the present invention includes: a substrate layer; a resin layer located on the upper side of the substrate layer; a circuit pattern formed in the resin layer through a mold; and one or more LED elements mounted and soldered on the resin layer.

In an embodiment, the circuit pattern may be imprinted in the resin layer through a mold pin located on the lower side of the mold and is filled with a liquid conductive material which forms a pattern in the form of a metal mesh, and the resin layer may be cured through irradiation of an ultraviolet ray.

The resin layer may be provided with a seating recess in which the LED element is seated, and an electrode terminal of the LED element seated in the seating recess may be soldered to be electrically connected to the conductive material.

According to an embodiment, a flexible printed circuit board (FPCB) for applying a voltage to the filled conductive material may be bonded to the circuit pattern, a surface of the flexible printed circuit board, on which a pin is printed, may be located to face an upper surface of the circuit pattern, in a state in which one end of the pin and a facing surface of the circuit pattern, which faces the one end of the pin, contact each other, the facing surface may be bonded by an ultrasonic ACF bonding technology or a thermal fusion ACF bonding technology, and the remaining area of the entire area of the flexible printed circuit board (FPCB), except for the area in which the pin is printed, may correspond to a removed state.

According to an embodiment, a cover layer for preventing penetration of foreign substances may be provided on the upper side of the substrate layer.

ADVANTAGEOUS EFFECTS OF THE INVENTION

According to an aspect of the present invention, the number of the manufacturing processes of the high-resolution transparent light emitting device of a large area can be minimized and productivity can be maximized by filling a liquid conductive material in the circuit pattern integrally imprinted and forming an electric circuit in the form of a metal mesh.

Further, according to an aspect of the present invention, screening of the field of view of a transparent attachment portion, such as a glass window, can be minimized by filling the metal mesh based on silver paste having an excellent surface resistance and a high transmittance in the imprinted circuit pattern.

Further, according to an aspect of the present invention, since the pin of the flexible printed circuit board (FPCB) is bonded to face the inner side while not protruding to the outside of the panel, the contact between the pin and the circuit pattern can be firmly maintained even if the distal end of the flexible printed circuit board is lifted.

In particular, according to an aspect of the present invention, since the contact between the pin of the flexible printed circuit board (FPCB) and the circuit pattern is firmly maintained, a stability of a mechanism part capable of preventing a situation, in which an intermediate portion of the flexible printed circuit board is short-circuited, in advance can be achieved.

DESCRIPTION OF THE DRAWINGS

FIG. 5 is a view illustrating a state in which the flexible printed circuit board is bonded on the circuit board.

BEST MODE

Hereinafter, preferred embodiments will suggested for understanding of the present invention. However, the following embodiments are provided simply for easier understanding of the present invention, and the contents of the present invention are not limited by the embodiments.

Figure 1:
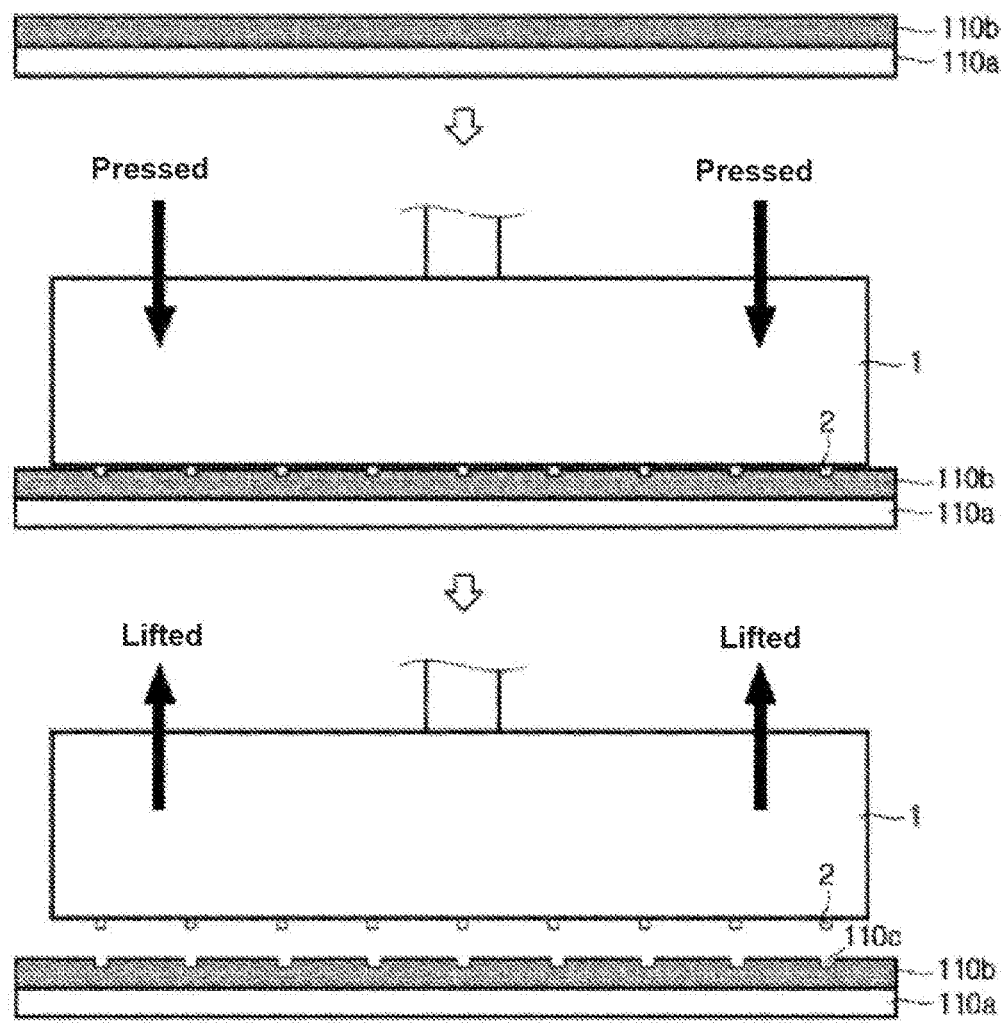
FIG. 1 is a view illustrating a step of forming a substrate layer in sequence in a method for manufacturing a transparent light emitting device using a UV imprinting technology according to an embodiment of the present invention.

FIG. 1 is a view illustrating a step of forming a substrate layer in sequence in a method for manufacturing a transparent light emitting device using a UV imprinting technology according to an embodiment of the present invention.

Figure 2:
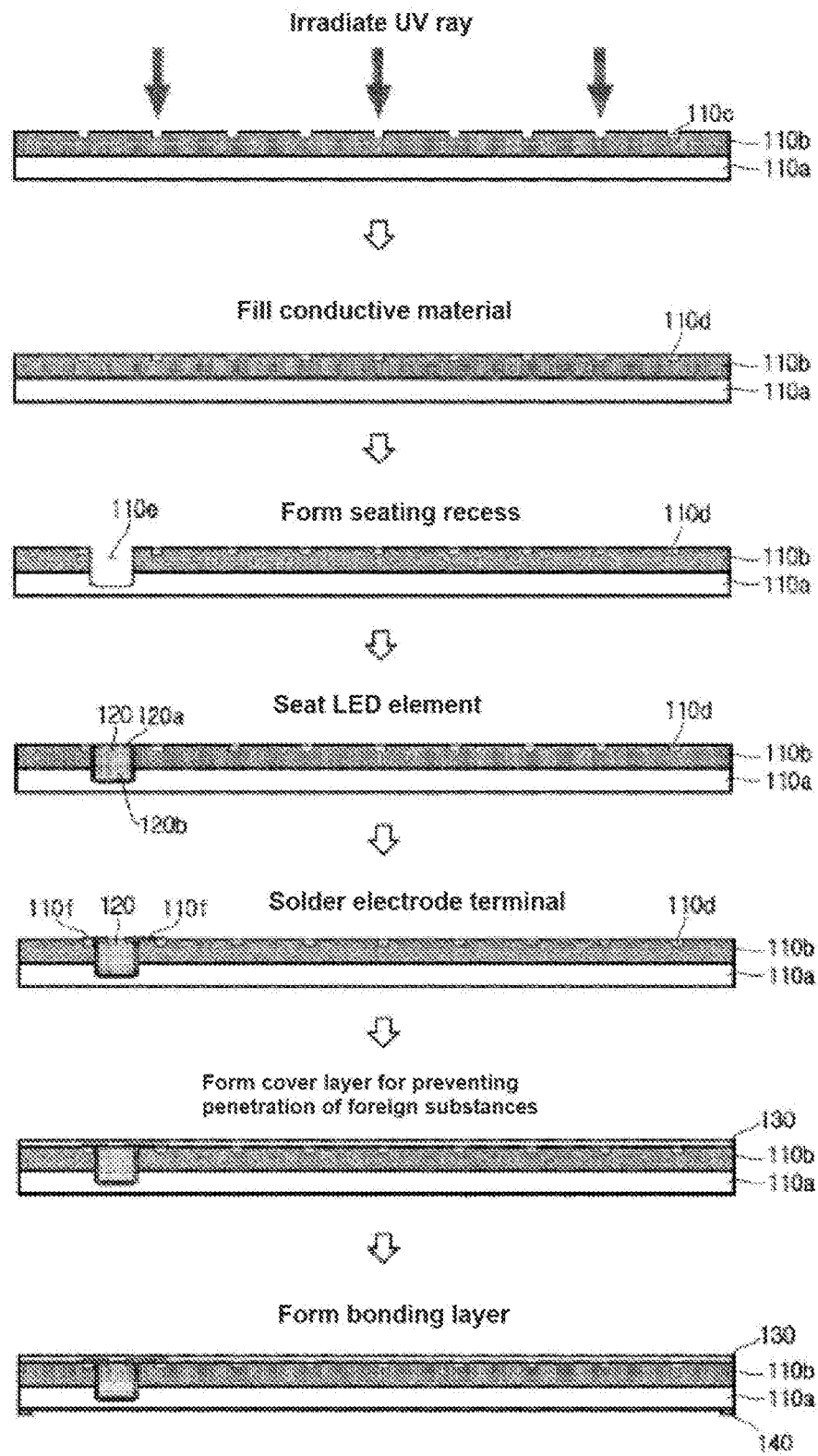
FIG. 2 is a view illustrating a step of forming a circuit pattern and mounting an LED element 120 in sequence in the method for manufacturing a transparent light emitting device using a UV imprinting technology according to the embodiment of the present invention.

FIG. 2 is a view illustrating a step of forming a circuit pattern and mounting an LED element 120 in sequence in the method for manufacturing a transparent light emitting device using a UV imprinting technology according to the embodiment of the present invention.

First, referring to FIG. 1, FIG. 1 is a view illustrating a step of forming a substrate layer 110 in sequence, and the substrate layer 110 may include a transparent substrate layer 110a and a resin layer 110b provided on the upper side of the transparent substrate layer 110a.

The transparent substrate layer 110a may have a thickness of 0.3 cm to 2 cm such that a space for mounting an LED element 120, which will be described below, is formed therein, and may be formed of a soft plastic material, for example, a material such as acryl, poly carbonate (PC), or PET, or may be formed of glass.

It is noted that the substrate layer 110 may be severely bent, causing a defect when the thickness of the transparent substrate layer 110a is less than 0.3 cm, and as the entire thickness and the entire volume of a transparent light emitting device 100 may increase, decreasing flexibility, and installation for non-planer environments such as a curve may be restricted when the thickness of the transparent substrate layer 110a is more than 2 cm.

Meanwhile, as a mold pin 2 in the form of a circuit pattern provided on the lower side of a mold 1 presses the upper surface of the resin layer 110b while the mold 1 is lowered downwards, the upper surface of the resin layer 110b may be imprinted in a form corresponding to the circuit pattern of the mold pin 2.

After the pressing, as the mold 1 is lifted upwards, an engraved circuit pattern 110c corresponding to the circuit pattern of the mold pin 2 may be formed on the upper surface of the resin layer 110b, and the resin layer 110b is cured if an ultraviolet (UV) ray is irradiated in a state in which a circuit pattern corresponding to the mold pin 2 of the mold 1 is formed.

Referring to FIG. 2, FIG. 2 is a view illustrating a process of actually forming a circuit pattern in the engraved circuit pattern 110c through FIG. 1 and seating and mounting the LED element 120 in sequence.

First, the resin layer 110b is cured by irradiating an ultraviolet (UV) ray to the upper side of the substrate layer 110 in which the engraved circuit pattern 110c is imprinted in the resin layer 110b, and the form of the engraved circuit pattern 110c is fixed through the process.

Thereafter, after the mold 1 is moved to the upper side of the resin layer 110b and is removed, a liquid conductive material (for example, gold, silver, or copper) is filled in the engraved circuit pattern 110c. Accordingly, an embossed circuit pattern 110*d* in the form of a metal mesh corresponding to the engraved circuit pattern 110*c* is formed.

Here, the embossed circuit pattern 110*d* may be formed of a metal mesh having an excellent surface resistance and a good permeability. The metal mesh may include a silver paste based metal mesh, a copper based metal mesh, or a metal mesh based on photo processing by depositing aluminum or copper.

Accordingly, as the embossed circuit pattern 110*d* is formed through a process of filling the conductive material later, a structure for soldering the electrode terminal 120*a* of the LED element 120 may be formed when the LED element 120 is seated and mounted later.

Then, the filling method is as follows.

The corresponding circuit pattern is filled by providing a predetermined amount of the conductive material on one side of the resin layer 110*b* and then squeezing the conductive material to one side through a blade. Thereafter, the conductive material stuck to an area, except for the circuit pattern, is removed through dry cleaning. Thereafter, the corresponding conductive material is cured through heat stiffening, and the heat then is slowly supplied to a low temperature area, minimizing a defect of the conductive material.

Next, after a seating recess 110*e* for seating the LED element 120 toward the insides of the resin layer 110*b* and the transparent substrate layer 110*a*, the LED element 120 is seated in the corresponding seating recess 110*e*. Thereafter, soldering for electrically connecting the electrode terminal 120*a* of the LED element 120 and the embossed circuit pattern 110*d* through a lead wire 110*f* is performed.

Accordingly, through all the processes of FIG. 2, the embossed circuit pattern 110*d* may be formed in the substrate layer 110, and the electrode terminal 120*a* of the LED element 120 and the embossed circuit pattern 110*d* may be soldered and electrically connected to each other through the lead wire 110*f* after the LED element 120 is mounted, as well.

Meanwhile, a light emitting surface 120*b* of the LED element 120 seated in the seating recess 110*e* are formed downwards with reference to FIG. 2.

That is, a bonding layer 140 provided on the lowermost side may be attached to a glass wall or a glass surface, and the light emitting surface 120*b* of the LED element 120 is naturally located to face the bonding layer 140.

This aspect may be allowed because the LED element 120 of the present invention/n is inserted reversely (a direction in which the light emitting surface 120*b* faces the bonding layer 140) instead of forwardly into the seating recess 110*e* formed toward the inner sides of the resin layer 110*b* and the transparent substrate layer 110*a*.

Accordingly, the method for manufacturing a transparent light emitting device using a UV imprinting technology according to the present invention may mean an imprinting process of implanting the LED element 120 inversely.

Meanwhile, the flexible printed circuit board (FPCB) for applying a voltage to the conductive material may be bonded to the transparent light emitting device, in which the circuit pattern is formed, by using an ACF bonding technology. Then, the flexible printed circuit board may mean a flexible cable configured to include a plurality of lead wires and a plurality of pins. Further, a distal end of the flexible cable may be electrically connected to the conductive material of the circuit pattern.

This will be discussed in more detail through FIGS. 4 and 5, which will be described later.

Figure 3:
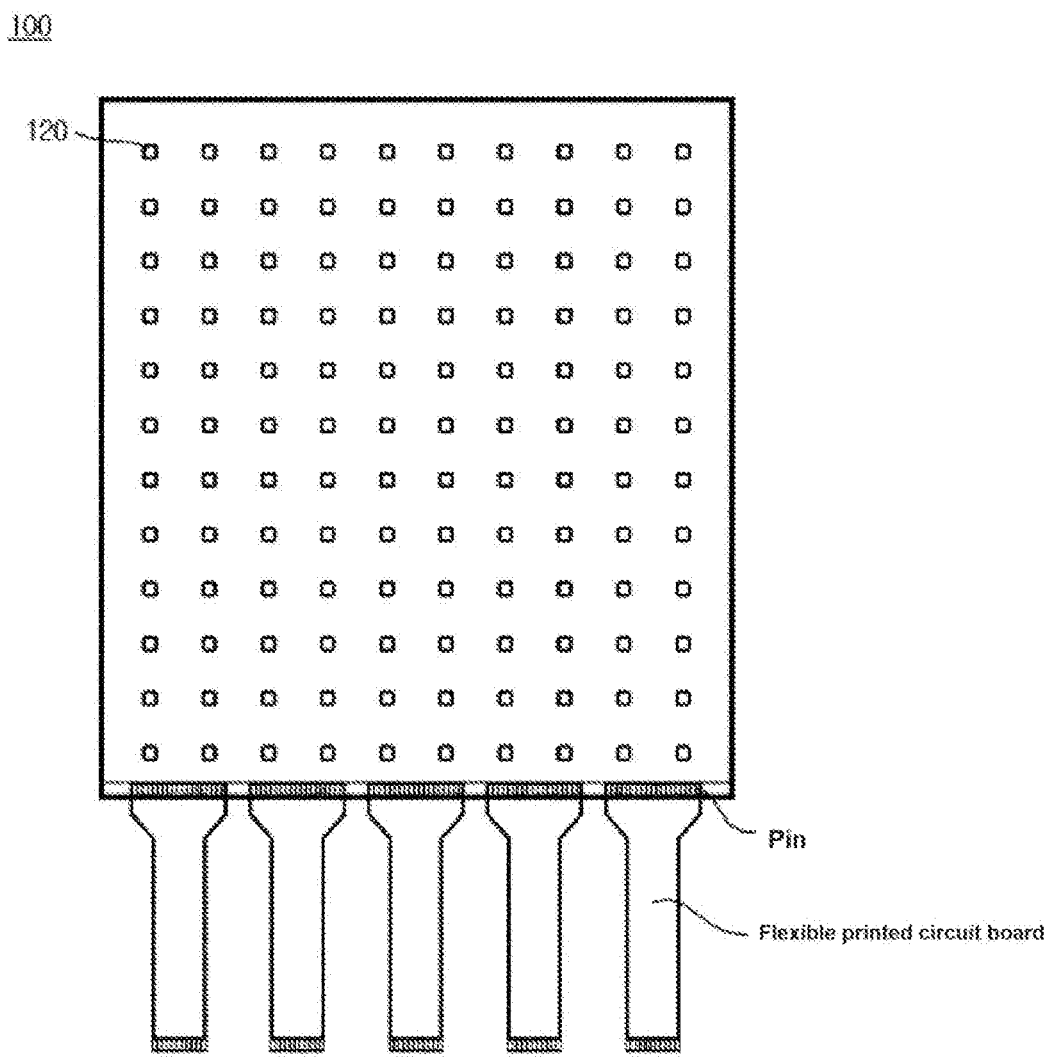
FIG. 3 is a view schematically illustrating a form of the transparent light emitting device 100 according to the present invention.

Next, the form of the transparent light emitting device 100 according to the present invention will be schematically discussed through FIG. 3.

Referring to FIG. 3, in the transparent light emitting device 100, after the transparent substrate layer 110*a* and the resin layer 110*b* illustrated in FIGS. 1 and 2 are formed to have large areas, the plurality of LED elements 120 are seated and mounted on the inner sides thereof.

Accordingly, an LED electronic display panel which may cover all of a building glass window of a wide range, a glass window of a bus stop, and a glass window for a vehicle can be realized. Further, both of the transparent substrate layer 110*a* and the resin layer 110*b* may be transparent (for example, may transmit 100% of light) or may have a transmittance of a predetermined level or more as well. Accordingly, a problem in which the field of view may be interrupted by the transparent light emitting device itself or the transparency cannot be secured according to the transparency for the inner and outer sides can be solved.

As illustrated in FIGS. 1 and 2, in the transparent light emitting device 100, the resin layer 110*b* is located on the upper side of the transparent substrate layer 110*a*.

The plurality of LED elements 120 are mounted on the resin layer 110*b* regularly in a predetermined arrangement. In particular, the flexible printed circuit board (FPCB) for applying a voltage to the conductive material filled in the circuit pattern is bonded on one side surface of the transparent light emitting device 100 through an ACF bonding technology.

The number of the transparent light emitting devices 100 may be different according to the area of the attachment surface. Accordingly, the plurality of transparent light emitting devices 100 may be used for an attachment surface of a large area, and one or two transparent light emitting devices 100 may be used for an attachment surface of a small area.

Meanwhile, since the material of the transparent substrate layer 110*a* may be formed of a soft plastic material, for example, a material such as acryl, PC, or PET, the transparent substrate layer 110*a* may be bent flexibly. Then, since the LED element 120 on the lower side of the transparent light emitting device 100 can emit light even if the transparent light emitting device 100 is bent, the transparent light emitting device 100 can maintain a light emission state even in a state in which the transparent light emitting device 100 is bent along a slow curve even if the attachment surface is not a flat surface.

Further, in an embodiment, an insulation layer (not illustrated) may be formed and interposed between the transparent substrate layer 110*a* and the resin layer 110*b* of the transparent light emitting device 100 manufactured according to the present invention. Then, the insulation layer may be formed of a polyimide resin, a polyester resin, a glass epoxy resin, an aluminum oxide, a silicon nitride film ($Si_3N_4$), or the like. Further, the insulation layer may be deposited through sputtering or an e-beam deposition method.

In addition, in an embodiment, non-solvent bonding layers (not illustrated) may be formed and interposed on opposite surfaces of the insulation layer (not illustrated), and then the non-solvent bonding layers may be non-solvent bonding tapes which do not generate bubbles.

Meanwhile, the light transmittance of the metal mesh pattern formed through the transparent light emitting device using a UV imprinting technology according to the embodiment of the present invention may be determined according to the pitch of the metal meshes.

For example, when the metal meshes having a width of 0.004 mm are formed at a pitch of 0.1 mm, the light transmittance of the transparent light emitting device 100 may be determined to be about 80%. Further, when the metal meshes are formed at a pitch of 0.05 mm, the light transmittance of the transparent light emitting device 100 may be determined to be about 75%.

As another example, when the metal meshes are formed at a pitch of 0.02 mm, the light transmittance of the transparent light emitting device 100 may be determined to be about 50%.

That is, as the pitch of the metal meshes become smaller (dense), resistance value becomes lower and light transmittance becomes lower, and to the contrary, if the pitch of the metal meshes becomes larger (loose), resistance value becomes higher and light transmittance becomes higher.

Although the present invention is carried out while the pitch of the metal meshes is about 0.1 mm such that the light transmittance of the transparent light emitting device 100 is determined to be about 80%, the present invention is not limited to the value, and it is noted that the value may be arbitrarily changed in consideration of the light transmittance of the transparent light emitting device 100.

In particular, according to the present invention, the resistance values for the distances of the LED elements 120 may be made to be the same by adjusting the number of metal meshes, and this will be discussed in more detail through FIG. 6.

It can be seen that a flexible printed circuit board is bonded to a periphery of one side of the transparent light emitting device 100 through an ultrasonic ACF bonding technology or a thermal fusion ACF bonding technology. Then, the flexible printed circuit board and the circuit pattern may be electrically connected through a plurality of pins, and a plurality of pins may be provided on the opposite side connected similarly.

Figure 4:
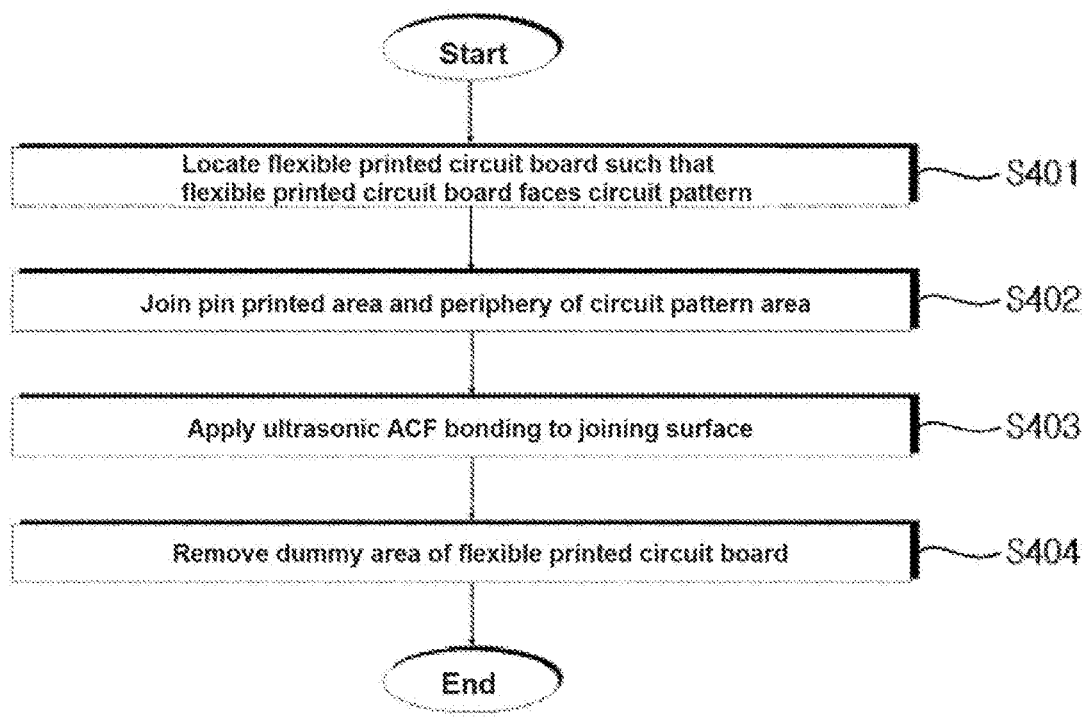
FIG. 4 is a view illustrating a process of bonding a flexible printed circuit board (FPCB) on a circuit pastern in sequence by using an ACF bonding technology.

FIG. 4 is a view illustrating a process of bonding a flexible printed circuit board (FPCB) on a circuit pastern in sequence by using an ACF bonding technology. FIG. 5 is a view illustrating a state in which the flexible printed circuit board is bonded on the circuit board.

Referring to FIGS. 4 and 5, since the flexible printed circuit board is manufactured to be ultra-slim, a coming off of one side of the transparent light emitting device can be prevented by the flexible printed circuit board even if the transparent light emitting device is attached to an attachment surface, such as a glass surface.

In particular, since the flexible printed circuit board has a thin thickness and a light weight and may be bent freely, a voltage can be stably supplied to the LED element of the transparent light emitting device even in an attachment area having a narrow space. Further, the problems due to the conventional troublesome wirings also can be solved.

A process of ACF bonding the flexible printed circuit board is as follows.

Referring to FIG. 4, first, a flexible printed circuit board, in which a flexible cable including a pin (or a lead wire) is printed, is provided on one side thereof is located on the upper side of the circuit pattern, and is located to face the upper surface of the circuit pattern (S401).

Then, an area of the entire area of the flexible printed circuit board, in which the flexible cable and the pin are printed, may be located to face the outside to deviate from a periphery of the circuit pattern, or may be located to face the inner side of the circuit pattern.

Next, the area in which the the flexible cable and the pin are printed and the circuit pattern contact each other. Then, the area in which the pin is printed and a peripheral area of the circuit pattern contact each other (S402).

Then, the area in which the pin is printed may mean a connection point (or a joining surface by a plurality of pin arrangements) at which the pin and the circuit pattern are electrically connected to each other.

Next, ultrasonic ACF bonding or thermal fusion ACF bonding is applied to the connection point (or the joining surface) between the pin and the circuit pattern (S403).

Then, in an embodiment, ultrasonic ACF bonding or thermal fusion ACF bonding may be applied to the joining surface between the pin and the circuit pattern, or ultrasonic ACF bonding or thermal fusion ACF bonding may be selectively applied only to an area corresponding to the form of the pin (or the lead wire).

Meanwhile, the number of lead wires included in the interior of the flexible printed circuit board may be arbitrarily changed according to the number of the mounted LED elements 120, the size and area of the transparent light emitting device 100, and the like. Accordingly, it is noted that the width and the length of the flexible printed circuit board are items that may be arbitrarily changed.

Next, an unnecessary remaining area (called a dummy area of the flexible printed circuit board) of the entire area of the flexible printed circuit board, except for the area in which the flexible cable and the pin are printed, is removed (S404).

An ultrasonic ACF bonding or thermal fusion ACF bonding result between the circuit pattern and the flexible printed circuit board, which is formed on the basis of the process, is as in FIG. 5.

First, referring to FIG. 5A, FIG. 5A is a view illustrating that ultrasonic ACF bonding or thermal fusion ACF bonding is applied in a state in which the pin contacts a periphery of the circuit pattern and the flexible cable deviates from the periphery of the circuit pattern.

In FIG. 5A, the pin is ACF bonded and electrically connected to the periphery of the circuit pattern, and as a short-circuit may be generated as the joining surface comes off or an intermediate portion of the flexible cable is folded, a defect of the entire transparent light emitting device may be caused.

Referring to FIG. 5B, FIG. 5B is a view illustrating that ACF bonding ACF bonding is applied in a state in which the pin contacts a periphery of the circuit pattern and the flexible cable does not deviate from the periphery of the circuit pattern and faces the periphery of the circuit pattern on the upper surface of the circuit pattern.

In FIG. 5B, the pin is ACF bonded to the periphery of the circuit pattern to be electrically connected to the periphery of the circuit pattern, and then, a distal end of the flexible cable faces a central portion of the circuit pattern.

Accordingly, even if the flexible cable is bent, the bonding state between the pin and the circuit pattern has no problem, and the flexible cable can be bent in the state in which the pin and the circuit pattern are bonded to each other while stably forming a round value.

That is, according to the present invention, the methods of FIGS. 5A and 5B may be selectively applied.

In an embodiment, a cover layer 130 for preventing penetration of foreign substances may be formed on the outer side (in more detail, the upper surface) of the substrate layer 110 of the transparent light emitting device 100. Accordingly, the outer side (in more detail, the area in which the LED element 120 and the electrode terminal 120a are soldered) of the transparent light emitting device 100 can be prevented from being contaminated by foreign substances or contaminants, which may be introduced from the outside toward the LED element 120.

In an embodiment, the bonding layer 140 may be formed along an outer peripheral surface of the lower surface of the transparent substrate layer 110a, and a bonding material which may be attached and detached several times may be applied to the bonding layer 140. It is noted that the bonding material applied to the bonding layer 140 is not limited.

Meanwhile, then, through the bonding force of the bonding layer 140 having a predetermined area along the outer peripheral surface of the lower surface of the transparent substrate layer 110a, the transparent light emitting device 100 may be attached to a glass wall or a glass surface. Then, the LED element 120 emits light toward a direction in which the bonding layer 140 is provided, and the light emitting state of the LED element 120 can be visually recognized from a direction in which the transparent light emitting device 100 is attached.

Figure 6:
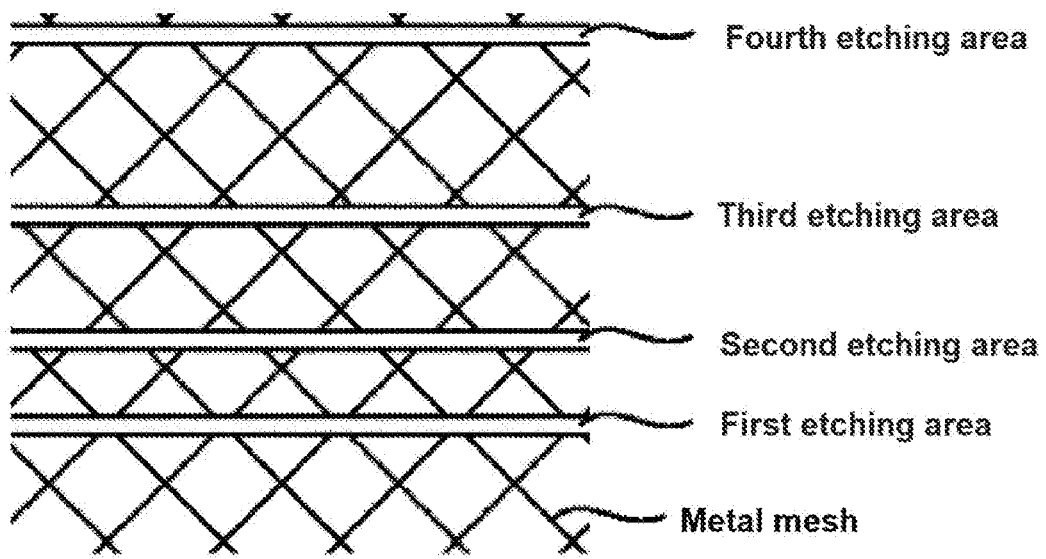
FIG. 6 is a view schematically illustrating a form of a metal mesh pattern formed by the present invention.

FIG. 6 is a view schematically illustrating a form of a metal mesh pattern formed by the present invention.

Referring to FIG. 6, the metal meshes having a width of about 0.004 mm form a metal mesh pattern densely at a pitch of 0.1 mm.

Then, an etching area which is etched along a transverse direction of the metal mesh pattern is present. The areas of the metal mesh patterns formed between the etching areas may be different according to the number of the metal meshes.

For example, one metal mesh is located between a first etching area located on the lowermost side and a second etching area located on the immediately upper side thereof. Two metal meshes are located between the second etching area and the third etching area, and three metal meshes are located between a third etching area and a fourth etching area.

That is, it can be identified that as the distance between the etching areas becomes larger, the number of the metal meshes located between them increases, and the area of the metal mesh pattern also increases as the number of the metal meshes increases.

Accordingly, the entire area of the metal mesh pattern also increases even if resistance value increases as the number of the metal meshes increases, and as a result, the resistance value can be maintained.

When it is assumed that the etching area is a site at which the LED element is located, the number of the metal meshes located between the LED elements increases as the distance between the LED elements becomes larger. Accordingly, the area of the metal mesh pattern also increases as the number of the metal meshes increases, and as a result, the resistance value between the LED elements can be maintained in the same way.

Meanwhile, it is noted that the number of the metal meshes formed between the LED elements is not limited to the above values.

Although the embodiments of the present invention has been described, it will be understood by an ordinary person in the art that the present invention may be variously corrected and modified without departing from the spirit of the present invention described in the claims.

The invention claimed is:

1. A method for manufacturing a transparent light emitting device using a UV imprinting technology, the method comprising:
   forming a substrate layer;
   forming a circuit pattern in a resin layer located on an upper side of the substrate layer through a mold, wherein forming the circuit pattern includes:
      imprinting the circuit pattern by pressing the resin layer through a mold pin located on a lower side of the mold;
      curing the resin layer by irradiating an ultraviolet ray to the imprinted circuit pattern; and
      forming the circuit pattern in a metal mesh form by filling a liquid conductive material in the circuit pattern after removing the mold; and
   mounting and soldering an LED element on the resin layer.

2. The method of claim 1, wherein the mounting and soldering of the LED element includes:
   forming a seating recess in which the LED element is seated, in the circuit pattern;
   seating the LED element in the seating recess;
   soldering the LED element such that an electrode terminal of the LED element is electrically connected to a conductive material; and
   bonding a flexible printed circuit board (FPCB) for applying a voltage to the conductive material to the circuit pattern by using an ACF bonding technology.

3. The method of claim 2, wherein the bonding of the flexible printed circuit board (FPCB) includes:
   locating a surface of the flexible printed circuit board (FPCB), on which a pin is printed, such that the surface of the flexible printed circuit board (FPCB) faces an upper surface of the circuit pattern; and
   bonding a facing surface of the circuit pattern which faces one end of the pin by using an ultrasonic ACF bonding technology or a thermal fusion ACF bonding technology.

4. The method of claim 3, wherein the bonding of the flexible printed circuit board (FPCB) includes:
   removing a remaining area of an entire area of the flexible printed circuit board, except for an area in which the pin is printed.

* * * * *